United States Patent [19]

Slinn

[11] Patent Number: 5,183,067
[45] Date of Patent: Feb. 2, 1993

[54] CLEANING AND DRYING OF ELECTRONIC ASSEMBLIES

[75] Inventor: David S. L. Slinn, Bristol, Great Britain

[73] Assignee: ISC Chemicals Limited, London, United Kingdom

[21] Appl. No.: 755,137

[22] Filed: Sep. 5, 1991

Related U.S. Application Data

[62] Division of Ser. No. 376,651, Jul. 7, 1989, Pat. No. 5,055,138.

[30] Foreign Application Priority Data

Jul. 8, 1988 [GB] United Kingdom ............... 8816343
Feb. 2, 1989 [GB] United Kingdom ............... 8902280

[51] Int. Cl.⁵ ................................................ B08B 3/10
[52] U.S. Cl. ............................................ 134/61; 34/77; 134/107; 134/108; 202/170
[58] Field of Search ................ 134/60, 61, 105, 107, 134/108, 109, 10, 11, 12, 31, 36, 902; 34/77, 78; 202/170

[56] References Cited

U.S. PATENT DOCUMENTS

| 3,028,267 | 4/1962 | Edhofer et al. | 134/105 X |
| 3,886,668 | 6/1975 | Redmond et al. | 34/9 |
| 3,923,541 | 12/1975 | Healy | 134/31 |
| 4,186,032 | 1/1980 | Ham | 134/31 |
| 4,414,067 | 11/1983 | McCord | 202/170 |
| 4,486,239 | 12/1984 | du Fresne | 134/11 |
| 4,556,456 | 12/1985 | Ruckriegel et al. | 202/170 X |
| 4,628,616 | 12/1986 | Shirai et al. | 34/78 |
| 4,745,690 | 5/1988 | Koop et al. | 34/78 X |
| 5,004,000 | 4/1991 | Berruex | 134/108 |

FOREIGN PATENT DOCUMENTS

| 670631 | 9/1963 | Canada | 134/108 |
| 194589 | 9/1986 | European Pat. Off. | |
| 485035 | 3/1970 | Switzerland | |
| 456821 | 11/1936 | United Kingdom | |

Primary Examiner—Philip R. Coe
Attorney, Agent, or Firm—Jacobson, Price, Holman & Stern

[57] ABSTRACT

Apparatus for cleaning and drying components, such as electronic or electrical components, by contact with a flammable liquid organic solvent, such as alcohol for example, including a reservoir (24) for a highly fluorinated compound, a heating device (22) for heating the reservoir and evaporating the highly fluorinated compound therefrom, a cleaning chamber (12) containing the liquid organic solvent (21) into which the components to be cleaned are emersed for cleaning, a fluid conduit (25) for conducting highly fluorinated compound vapor from the reservoir (24) to the cleaning chamber (12) to cover the organic liquid (21) in the cleaning chamber and directly heating the organic liquid, cooling coils (13) on which the vapor above the organic liquid condenses in the tank (12). Heavy, largely immiscible condensate sinks to the bottom of the tank (12) and is pumped by a pump (20) through a filter (19) to a gravity separator (14). In the separator (14) the fluorinated compound returns by gravity to the reservoir, or boiling chamber (24) and the organic liquid returns to the tank (12) through conduits (18 and 16, respectively).

14 Claims, 3 Drawing Sheets

CLEANING AND DRYING OF ELECTRONIC ASSEMBLIES

This is a division of application Ser. No. 07/376,651, filed Jul. 7, 1989 now U.S. Pat. No. 5,055,138.

BACKGROUND OF THE INVENTION

This invention relates to the cleaning and drying of electronic assemblies, and especially to an apparatus for cleaning and drying components, by which is meant both electronic and electrical components.

There is a need, within the electronics industry, for a solvent which can remove flux residues, other soils and water from printed-circuit boards and from other electronic components and assemblies, the water being removed by solubilization.

An ideal solvent for such a purpose should have the following properties:

TABLE 1

(1) It should be non-toxic
(2) It should be non-flammable
(3) It should not attack plastics materials
(4) It should have high penetrating power
(5) It should be thermally stable
(6) It should be able to dissolve both polar and non-polar soils
(7) It should have excellent dielectric properties
(8) It should not be too expensive.

For many years 1,1,2-trichloro-trifluoroethane has been the preferred solvent although it has often been necessary to blend it with minor proportions of polar organic solvents (especially lower aliphatic alcohols) to increase its solvent power. Also the solvent action will normally be aided by agitation, e.g. by means of spraying, boiling, sparging or ultrasonic vibration. Typical formulations are to be found, for example, in UK patent specification Nos. GB-A-1,330,534; 1,377,156; 1,469,264; 1,495,327 and 1,534,734.

In more recent years, and especially since 1980, the chlorofluorocarbons (CFC's) generally have become subject to suspicion that they may possibly contribute to depletion of the ozone layer in the upper atmosphere. There is therefore a move to reduce and eventually to phase-out the release of chlorofluorocarbons into the earth's atmosphere. It is therefore desirable to phase out CFC's from uses where there is likely to be appreciable escape of CFC's into the atmosphere.

The present invention provides an alternative method of cleaning and drying especially for electronic assemblies and components in which a highly fluorinated organic compound not containing chlorine or bromine (HFO) is used in conjunction with a solvent (usually a polar organic solvent) of higher solvent power than the highly fluorinated compound. HFO's have, in general, very poor solvent power and are only partially miscible with most other solvents. However HFO's are inert chemically and have very good compatibility with plastics materials. The functional hydrocarbon organic solvents such as aliphatic alcohols, ketones, nitriles, nitro-alkanes and acetals have relatively high solvent power especially with respect to polar soils, but they are almost invariably flammable. If the chlorofluorocarbons are removed from consideration then the chlorinated and brominated solvents remain but they do not have the required low toxicity and compatibility with plastics materials.

By "HFO" we mean an organic compound which contains predominantly carbon and fluorine atoms but possibly a minor proportion of hydrogen atoms with or without oxygen or nitrogen atoms.

BRIEF SUMMARY OF THE INVENTION

An object of this invention is to provide a cleaning and drying apparatus, especially for electronic assemblies/components, wherein a flammable liquid of relatively greater solvent power than a HFO is used in combination with a fluorinated organic compound, thus reducing the flammability hazards to a minimum.

The present invention in provides an apparatus for cleaning and drying components using a hydrogen-containing flammable, liquid organic solvent in a container, wherein the solvent surface is covered by a vapour layer rich in a highly fluorinated organic compound (as herein defined), which transfers heat to the organic solvent, and the component to be cleaned is contacted with the liquid organic solvent, removed therefrom, vapor rinsed or dried in the highly fluorinated compound-rich vapor layer and then removed from the cleaning environment.

Preferred organic solvents are lower aliphatic alcohols having 1 to 5 carbon atoms (e.g. ethanol, iso-propanol) although other functional solvents such as ketones, nitriles, and nitro-alkanes may be used. It should be understood that the organic solvent can contain highly fluorinated compound up to the saturation concentration (saturation solubility) of that compound in the organic solvent.

For electronic component cleaning the preferred HFO compounds are perfluoro-n-alkanes, perfluoro-alicyclic compounds, perfluoro-amines and perfluoro-ethers with a preferred boiling range between +30° and +100° C. In other cleaning or de-greasing applications these temperatures may be exceeded and typically may be between 100° and 250° C. However, such HFO compounds need not be completely fluorinated. The compound is most preferably a perfluoro (alkyl- or polyalkyl-cyclohexane).

Particularly suitable hydrogen-containing fluorinated organic compounds include:

| | |
|---|---|
| Perfluoro-1-hydro-n-pentane | Bpt. 45° C. |
| Perfluoro-1-hydro-n-hexane | Bpt. 70° C. |
| Perfluoro-1,3-dihydro-cyclohexane | Bpt. 78° C. |

The organic solvent layer may contain water up to the azeotropic composition of the water/organic solvent system.

To avoid losses it will be necessary to separate and to conserve solvent and fluorinated compound by means of cooling/condensation/recycling means known to the art.

Thus, the invention provides apparatus for cleaning and drying components, comprising a highly fluorinated compound reservoir, means for heating and evaporating highly fluorinated compound from said reservoir, means for conducting highly fluorinated compound to a cleaning chamber to cover an organic liquid in the chamber, means for conducting components to be cleaned in and out of the chamber and means for condensing and re-cycling highly fluorinated compound and organic solvent to their respective reservoirs.

Preferably the heating means is an electrical element or heating coil.

The highly fluorinated compound vapor is preferably passed to the cleaning chamber wherein it directly heats the organic liquid.

The condensing means are suitably cooling coils.

There may be a plurality of cleaning compartments, interconnected at their bases by ducts, which are at least partially filled with liquid highly fluorinated compound, thus preventing mixing of solvent in the different compartments at their bases. Ducts may be connected to the highly fluorinated compound reservoir via a fluorinated compound/organic solvent separator which is vented to the vapor space above the organic solvent.

BRIEF DESCRIPTION OF THE INVENTION

The invention will be further described, by way of example only, with reference to the accompanying drawings, wherein each of FIGS. 1 to 4 is a schematic view of an apparatus according to the invention.

DETAILED DESCRIPTION

In the following description reference to perfluoro compounds are to be taken to include reference to highly fluorinated organic compounds as defined above.

A relatively simple form of apparatus according to the invention will now be described with reference to FIG. 1.

Figure 1:
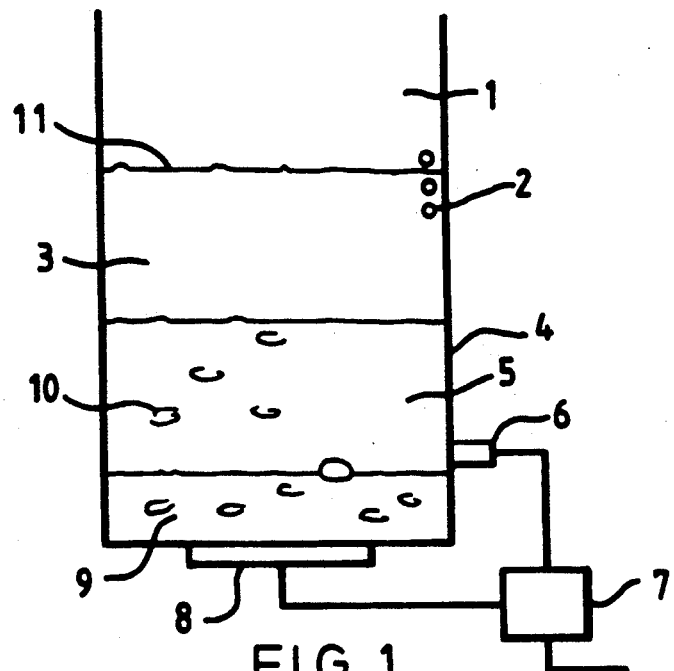

FIG. 1 shows a tank 4 containing a heavy perfluorocarbon layer 9 and a flammable solvent layer 5. These remain separate layers because the two liquids are mostly immiscible. A heater 8 is fixed to the bottom of tank 4 and cooling coils 2 are located inside the upper part of the tank. When the heater 8 is actuated, fluorocarbon vapor bubbles 10 rise through the flammable solvent layer 5 and form a perfluorocarbon-rich vapor blanket 3. The vapour level 11 is controlled by cooling coils 2 which condense the vapor and the resultant liquid returns by gravity into the solvent layer when it then sinks back into the perfluorocarbon layer 9. Loss of perfluorocarbon from the tank gradually occurs, the rate depending on the design of suitable recovery systems. Because of this loss, the perfluorocarbon layer 9 reduces in level and may finally result in a hazardous situation, should the perfluorocarbon be lost. To prevent this, a float switch 6 is connected to a power supply 7 so that power is automatically switched-off in the event of excessive perfluorocarbon loss.

Any suitable perfluoro-compound/organic solvent combination may be used, provided that sufficient perfluoro-compound is present in the vapor space above the solvent to render the vapor non-flammable.

In the case of the apparatus shown in FIG. 1 the boiling point of the perfluoro-compound needs to be below about 60° C., where lower aliphatic alcohols are used as solvent.

Still with reference to FIG. 1, the cleaning sequence for a component to be cleaned is as follows:

The component to be cleaned is lowered into the solvent layer 5 for an appropriate time. The component is then raised into the freeboard zone 1 and allowed to remain there for sufficient time for cooling to take place.

The cooled component is then lowered into vapor zone 3 causing condensation of vapor on the component which thus comprises a rinse in perfluoro-compound fluid where residual alcohol is removed, together with traces of contaminants. After the vapor rinse the component is steadily raised again and out of the vapor layer 3 and drying occurs almost immediately as the component emerges from the vapor. The component thus finishes the process in a dry clean state in contrast to cleaning in alcohol alone where flammable alcohol residues remain on the component after cleaning. This example would be suitable for perfluorocarbons with boiling points up to about 60° C. combined with ethyl or iso-propyl alcohols.

A more sophisticated and safer apparatus embodiment according to the invention will now be described, by reference to FIG. 2.

Figure 2:
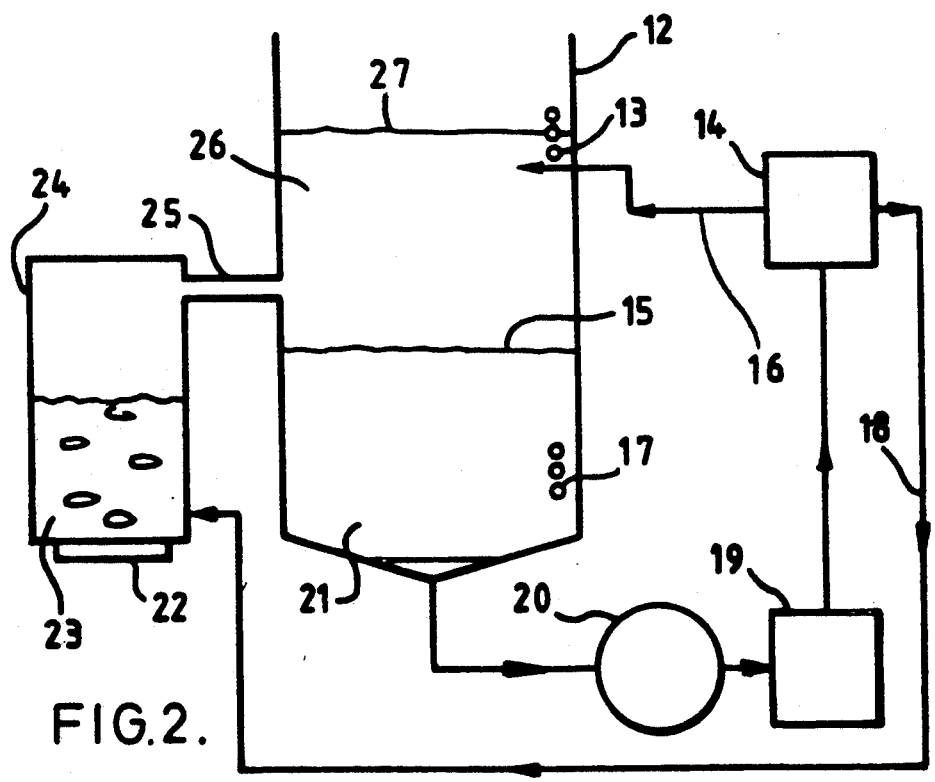

FIG. 2 shows a boiling chamber 24 containing perfluoro-carbon 23 heated by means of heater 22. Vapor from the chamber is led via conduit 25 into tank 12 where it forms a vapor blanket 26 above the flammable solvent layer 21 which comprises an alcohol layer. The level of the blanket is controlled by cooling coils 13 whilst cooling coils 17 maintain the temperature of the alcohol layer 21 below that of the vapor 26. During the course of operation, vapor condenses on cooling coils 13 and on surface 15. The heavy, largely immiscible condensate sinks to the bottom of tank 12 and is then transported by means of a pump 20 through filter 19 to a gravity separator 14. After separation, the perfluorocarbon returns by gravity to boiler 24 and the alcohol returns to tank 12 via lines 18 and 16, respectively.

The cleaning sequence using this apparatus is as follows:

The component is lowered into the cool solvent layer 21 where removal of contaminants take place. Solvent 21 can be agitated by a stirrer, ultrasonics or some other means if necessary. After immersion of the component in solvent 21 it is then raised into vapor layer 26. Since the component is lower in temperature than the vapor layer, condensation occurs on the component surface thus giving a rinse in freshly distilled fluid. After the condensate rinse, the component is raised steadily out of the tank and drying occurs as the component passes through the vapor/air interface 27.

In a third embodiment, which will be described with reference to FIG. 3, provision is made for safe and continuous flammable solvent distillation, which thus prolongs the useful life of the solvent and reduces the necessary frequency of clean-out of the apparatus thus reducing disposal problems.

Figure 3:
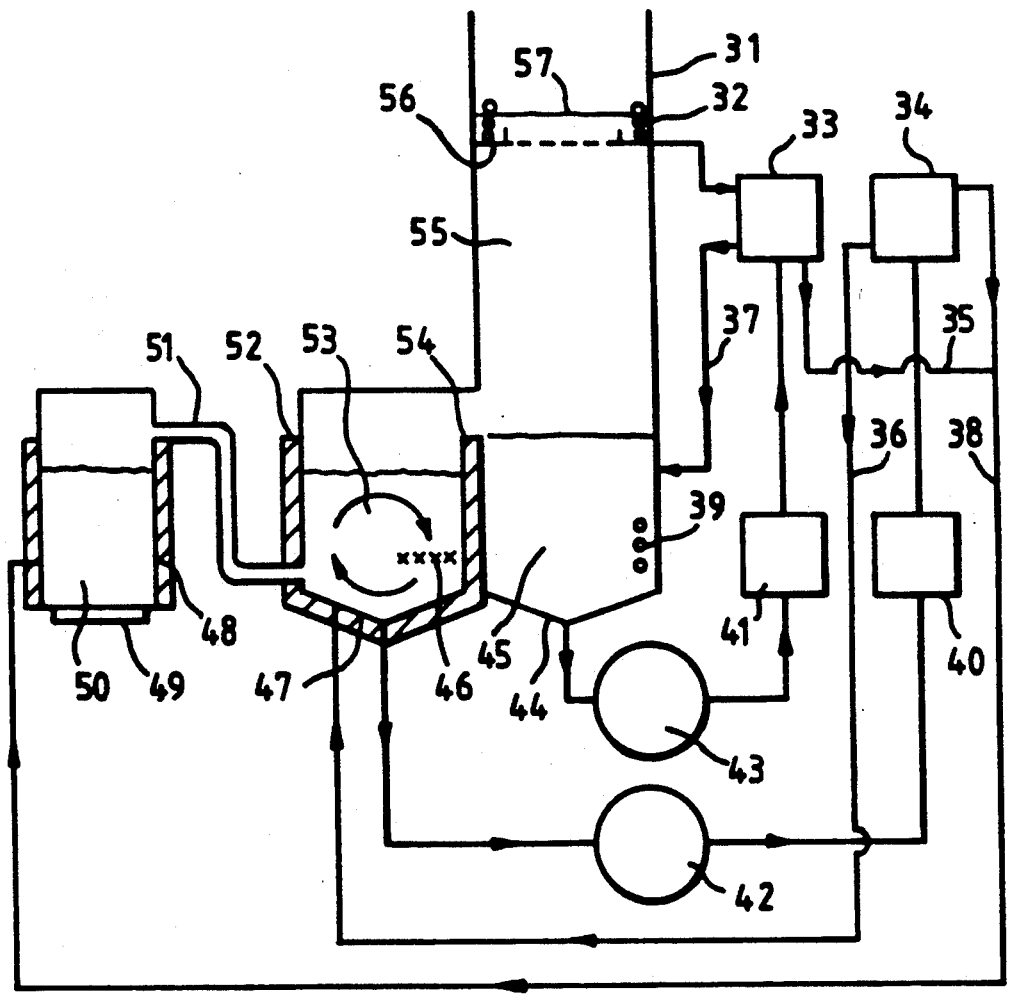

With reference to FIG. 3, tank 31 comprises an offset compartment 47, containing the organic solvent 53 to be distilled, and compartment 44 containing the solvent 45 used for cleaning. A separate, sealed boiling compartment 48 contains perfluorocarbon 50 heated by means of heater 49. When the perfluorocarbon boils, vapor passes through conduit 51 into the solvent 53. The entry of conduit 51 is situated to one side of compartment 47 thus causing a rolling action of solvent 53 in the direction shown by the arrows. During the solvent warming-up period, vapor condenses in solvent 53 as small droplets. These are carried by the rolling action to gauze 46 where coalescence occurs. The larger droplets then sink to the base of compartment 47. Pump 42 continuously circulates the liquid mixture from compartment 47 through filter 40 into separator 34. The solvent is then returned by gravity via line 36 to compartment 47 and the perfluorocarbon returns by gravity to boiler 48 via line 38.

When the solvent in compartment 47 heats-up to the boiling point of the particular fluorocarbon in boiler 48 the condensation of perfluorocarbon in solvent 53 practically ceases, to a rate dictated by small heat losses through insulation 52 on compartment 47. At the same time, the evaporation rate of the solvent 53 increases.

The evaporation rate is enhanced by the fact that perfluorocarbon/solvent mixtures have higher vapor pressures than either component alone, resulting in a reduction of boiling point giving an effect similar to steam distillation. The perfluorocarbon/solvent vapor rises to a level 57 controlled by cooling coils 32. Condensation takes place both on coils 32 and on solvent 45 surface, the latter being maintained cool by means of coils 39. Perfluorocarbon/solvent mixture condensing on coils 32 is collected in annular trough 56 from whence it flows by gravity to separator 33. Perfluorocarbon condensing on the surface of solvent 45 falls to the base of compartment 44 from where it is continually removed by means of pump 43, through filter 41 to separator 33. After the separation of both feed streams in separator 33, solvent is returned by gravity to compartment 44 via line 37. Similarly, the separated perfluorocarbon is returned to the boiler via lines 35, 38. Both separators 33, 34 need to be at sufficient height to overcome back-pressure in boiler 48 equivalent to the height of liquid 53 in compartment 47.

A situation thus exists where freshly distilled solvent is continuously fed into compartment 44 thus providing a continuous purification facility. Also, solvent flows over weir 54 back into compartment 47 at a rate equivalent to the solvent distillation rate from compartment 47. Dissolved contaminants such as flux and oil thus concentrate in compartment 47 whilst the solvent 45 in compartment 44, in which the components are immersed, is continuously purified.

The cleaning sequence is as follows:

Components to be cleaned are lowered into cool solvent 45 contained in compartment 44. Contaminants, such as flux, dissolve and this may be assisted by stirring, pressure jets, ultrasonic agitation etc. if so required. The component is then raised into the vapor layer 55 where condensate forms on the component providing a rinse in pure fluid. The component is then raised steadily out of the vapor and drying occurs as the component emerges at the vapor/air interface 57.

This embodiment is suitable for use with perfluorocarbons boiling up to about 60° C. Higher-boiling perfluorocarbons may be used if the vapor inlet 51 is divided so that a proportion of the vapor goes directly into vapor space 55.

The above three examples have been given for illustrative purposes and, obviously, further modifications and improvements could be envisaged, for example, a spray rinse stage could be incorporated within the vapor layer of each of the examples given. Also, the schemes shown would require efficient fluid recovery systems to be fitted in order to remain economical.

In a fourth embodiment, which will be described with reference to FIG. 4, provision is made for safe and continuous distillation without the need for pumps to transfer liquid to separators, as is required for FIG. 3.

Figure 4:
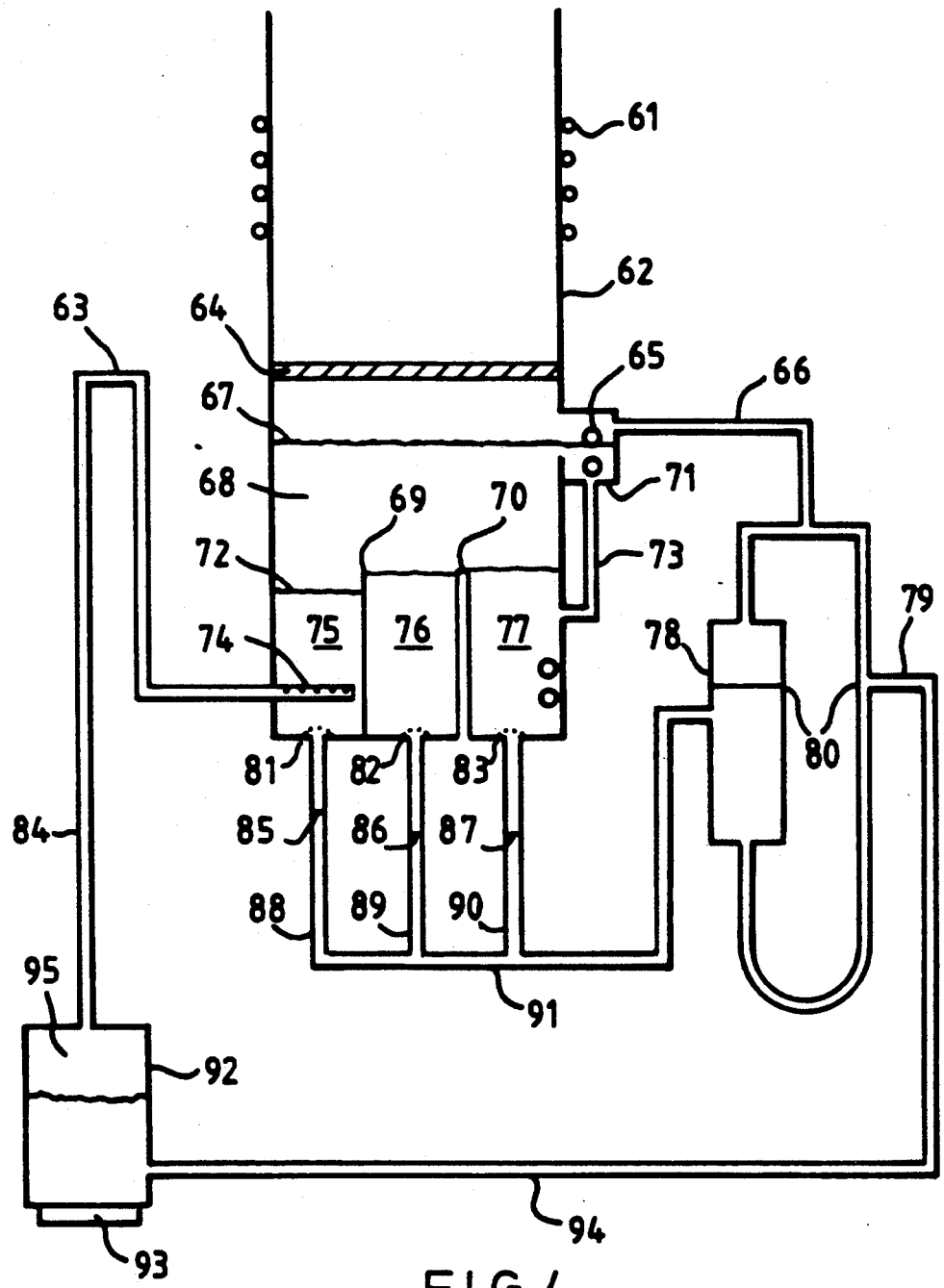

With reference to FIG. 4 a main tank 62 contains compartments 75, 76, 77 at the base, each filled with a flammable organic liquid such as alcohol. Compartments 75, 76, 77 are connected to outlet tubes 88, 89, 90 respectively via filters 81, 82, 83. The tubes 88, 89 and 90 are each partly filled with the flammable liquid and partly filled with perfluorocarbon liquid defined by the interphase 85, 86, 87 respectively. Outlet tubes 88, 89, 90 are connected via tube 91, which is also filled with perfluorocarbon, to perfluorocarbon filled separator 78 containing liquid at height 80 controlled by outlet tube 79. A situation thus exists where dense perfluorocarbon of height 79 balances columns of perfluorocarbon/alcohol in compartment/outlet tube combinations 75, 88; 76, 89 and 77, 90 of higher levels, e.g. 72 in compartment 75. The respective levels 85, 86, 87 automatically adjust during operation.

During operation, perfluorocarbon liquid in container 92 is boiled by means of heater 93 causing vapor to emerge via tube 84 from where it is injected into compartment 75 via outlet nozzles 74. The perfluorocarbon-rich vapor 68 thus formed is controlled at level 67 by cooling coils 65. Condensate thus formed is collected in trough 71 and returned via tube 73 to compartment 77. Excess flammable organic liquid in compartment 77 flows over insulated weir 70 into compartment 76 and from thence over weir 69 into compartment 75 where evaporation recommences. By this means, any soluble contaminants entering the organic solvent are concentrated in compartment 75 whilst compartments 76 and 77 are continuously cleansed. Perfluorocarbon liquid entering any of the compartments 75, 76, 77 sinks to the bottom and separates to flow through tubes 88, 89, 90 and 91 back through separator 78, outlet 79, line 94 to boiler 92 where the cycle recommences. A pressure balancing line 66 is interconnected to separator 78 and boiler return line 94. This has two purposes:

(a) To prevent air being trapped in the top of separator 78 thereby adversely affecting pressure balancing and levels in the separator; and (b) To avoid suck-back of flammable solvent into the boiler via line 84, i.e. when boiler 93 cools, the vapor in vapour space 95 condenses and causes a partial vacuum which can be relieved via line 94 providing that the hydrostatic head in line 94 is less than that necessary to raise the liquid entering line 84 from compartment 75 to level 63.

Fluid conservation is assisted by a penetrable screen 64, such as elongated brush seals, and refrigerated coils 61 wound around the upper section of tank 62. The screen 64 prevents external air currents from disturbing the vapor air interface 67. The refrigerated coils 61 cause a cool layer of air, denser than the external surroundings, which remains in tank 62 thus minimizing any fluid emission from the tank.

Components to be cleaned are lowered through screen 64 into compartment 76 which might include ultrasonic agitation or pressurized liquid jetting. After a suitable time in compartment 76 the component is raised into vapor space 68 during which time a condensate rinse may occur depending on the temperature of the liquid in compartment 76. The component is then immersed for a suitable time in cooled compartment 77 and then again raised into vapor space 68 where another condensate rinse occurs. The component is then removed from the tank via the penetrable screen 64. Other cleaning sequences could be used, for example the heated and agitated liquid in compartment 75 could be used as the first immersion stage.

In performing the invention, any highly fluorinated compound, particularly any perfluorinated organic compound (pfc), having a suitable boiling point would be suitable as a non-flammable vapor layer. These would generally be compounds comprising fluorine and carbon only in the molecule or those which include a hetero atom such as oxygen or nitrogen. Thus, perfluorinated ethers and amines are possible. Because of the poor solvency of perfluorocarbons and the need to provide an effective rinse in the vapor condensation stages of the above examples, the preferred perfluorocarbons would be those which show maximum solubility in the chosen organic solvent. However, in the liquid phase it is desirable that the organic solvent and the pfc remain as immiscible as possible for the following reasons:

1. To promote as complete separation of the two liquids as possible to avoid loss of expensive pfc with discarded organic liquid.

2. To minimize contaminants dissolved in the pfc since organic solvents mixed with pfc will increase the concentration of dissolved contaminants.

Typically suitable perfluoro-compound/organic solvent pairs are given in examples 1-5 in Table 2 below:

TABLE 2

| Perfluorocarbon | Flammable Solvent |
| --- | --- |
| 1. Perfluoro(methylcyclohexane) (Bpt. 76° C.) | Ethyl alcohol (Bpt. 78° C.) |
| 2. Perfluoro(methylcyclohexane) (Bpt. 76° C.) | Isopropyl alcohol (Bpt. 82° C.) |
| 3. Perfluoro(dimethylcyclohexane) (Bpt. 100° C.) | n-propyl alcohol (Bpt. 97° C.) |
| 4. Perfluoro(n-hexane) (Bpt. 57° C.) | n-propyl alcohol (Bpt. 97° C.) |
| 5. Perfluoro(methycyclopentane) (Bpt. 47° C.) | n-propyl alcohol (Bpt. 97° C.) |

A preferred method of reducing the mutual miscibility of the alcohol/pfc is to add a proportion of water. A further advantage of water addition is to increase the solubility of polar contaminants in the alcohol phase.

The proportion of added water preferably should not exceed the azeotropic composition of water in the appropriate organic solvent.

Also, since compatability is a function of temperature, a minimum perfluorocarbon boiling point is chosen compatible with effective cleaning, which normally improves with temperature. Generally, perfluorocarbon boiling points in the range 40° C. to 100° C. are most widely useful. Where continuous solvent distillation is required those perfluorocarbons having a boiling point close to that of the solvent are most useful. Reference to Table 3 will show that perfluoromethylcyclohexane (PP2) and isopropyl alcohol are a particularly useful pair for the following reasons:

TABLE 3

| Aspect | Advantage |
| --- | --- |
| Boiling points similar | Alcohol evaporates at a rate sufficient for efficient alcohol purification. |
| 19% w/w solubility of PP2 in alcohol at 25° C. | 1. Flammability risk reduced if solvent leaks from joints. 2. Better solubility of polar contaminants in the fluid mixture condensing from the vapor, phase. |
| 0.4% solubility of alcohol in PP2 | After separation, fluid returning to the boiler is substantially perfluorocarbon. |
| 76° boiling point of PP2 | 1. Similar to that of isopropanol alcohol. 2. Alcohol distills at a |

TABLE 3-continued

| Aspect | Advantage |
| --- | --- |
| | suitable rate for purification by distillation. |
| | 3. Boiling point low enough to give good compatibility and minimal thermal damage. |
| | 4. Boiling point high enough to impart good solvency to isopropyl alcohol. |

I claim:

1. Apparatus for cleaning and drying components comprising:
a reservoir for a highly fluorinated compound;
heating means for heating and evaporating said highly fluorinated compound;
a cleaning chamber;
an organic liquid solvent in said cleaning chamber;
a space above said organic solvent in said cleaning chamber;
means for conducting highly fluorinated compound vapor produced by said heating and evaporating means to said cleaning chamber for covering and directly heating said organic solvent in said cleaning chamber;
said components to be cleaned being immersed into and removed from said organic solvent in said cleaning chamber;
means for condensing said highly fluorinated compound vapor in said cleaning chamber; and
means for recycling said highly fluorinated compound and organic solvent to said reservoir and cleaning chamber, respectively.

2. Apparatus as claimed in claim 1 wherein:
said heating means comprises an electrical heating element.

3. Apparatus as claimed in claim 2 wherein: said condensing means comprises cooling coils.

4. Apparatus as claimed in claim 1 wherein:
said heating means comprises a heating coil.

5. Apparatus as claimed in claim 1 wherein:
said condensing means comprises cooling coils.

6. Apparatus for cleaning and drying components comprising:
a reservoir for a highly fluorinated compound;
heating means for heating and evaporating said highly fluorinated compound;
a cleaning chamber;
an organic liquid solvent in said cleaning chamber;
a space above said organic solvent in said cleaning chamber;
means for conducting highly fluorinated compound vapor produced by said heating and evaporating means to said cleaning chamber for covering said organic solvent in said cleaning chamber;
said components to be cleaned being immersed into and removed from said organic solvent in said cleaning chamber;
means for condensing said highly fluorinated compound vapor in said cleaning chamber;
means for recycling said highly fluorinated compound and organic solvent to said reservoir and cleaning chamber, respectively;

a plurality of cleaning compartments in said cleaning chamber, each compartment having a base;

a separate outlet duct means connected to each base of a respective cleaning compartment;

a further duct interconnecting said outlet duct means at positions thereof remote from said bases for connecting said outlet duct means to said recycling means; and liquid highly fluorinated compound at least partially filling said outlet duct means for preventing mixing of said organic liquid in said different compartments at said bases thereof.

7. Apparatus as claimed in claim 6 wherein:
said recycling means comprises a fluorinated compound/organic solvent separator means; and further comprising:

vent means connecting said separator means to said space above said organic solvent containing highly fluorinated compound vapor.

8. Apparatus as claimed in claim 7 wherein:
said heating means comprises an electrical heating element.

9. Apparatus as claimed in claim 8 wherein:
said condensing means comprises cooling coils.

10. Apparatus as claimed in claim 7 wherein:
said heating means comprises a heating coil.

11. Apparatus as claimed in claim 7 wherein:
said condensing means comprises cooling coils.

12. Apparatus as claimed in claim 6 wherein:
said heating means comprises an electrical heating element.

13. Apparatus as claimed in claim 6 wherein:
said heating means comprises a heating coil.

14. Apparatus as claimed in claim 6 wherein:
said condensing means comprises cooling coils.

* * * * *